United States Patent [19]

Yoshida et al.

[11] Patent Number: 4,670,117

[45] Date of Patent: Jun. 2, 1987

[54] ELECTRODIALYTIC METHOD OF GROWING WATER-SOLUBLE IONIC CRYSTAL

[75] Inventors: Kunio Yoshida, Takatsuki; Chiyoe Yamanaka, Ashiya; Takatomo Sasaki, Suita; Osamu Shimomura, Kofu, all of Japan

[73] Assignee: Osaka University, Suita, Japan

[21] Appl. No.: 828,246

[22] Filed: Feb. 11, 1986

[30] Foreign Application Priority Data

Feb. 16, 1985 [JP] Japan ............................ 60-27540

[51] Int. Cl.$^4$ ............................................. B01D 13/02
[52] U.S. Cl. ................................. 204/182.4; 204/301
[58] Field of Search ........................... 204/182.4, 301

[56] References Cited

U.S. PATENT DOCUMENTS

| Re. 28,192 | 10/1974 | Schulz | 204/182.4 |
| 3,489,665 | 1/1970 | Chandler | 204/182.4 |
| 3,502,556 | 3/1970 | Chandler | 204/301 |
| 4,454,012 | 6/1984 | Bachot et al. | 204/182.4 |

Primary Examiner—Terryence Chapman
Attorney, Agent, or Firm—Spencer & Frank

[57] ABSTRACT

A solution of material for the desired crystal is filled in a growth tank having two ion-exchange membranes which define a crystal growth vessel between them and two side vessels on opposite sides of the crystal growth vessel, and the growth tank is placed in an outer tank while filling a fluid therebetween. During electrodialysis in the growth tank, the crystal growth vessel solution temperature $T_c$, the side vessel solution temperature $T_o$, and the fluid temperature $T_w$ between the tanks are controlled so as to keep the conditions of $T_o > T_c > T_w$.

3 Claims, 2 Drawing Figures

ELECTRODIALYTIC METHOD OF GROWING WATER-SOLUBLE IONIC CRYSTAL

BACKGROUND OF THE INVENTION

1. Field of the Invention

This invention relates to a method of producing an optically non-linear ionic crystal for high output laser. More particularly, the invention relates to an electrodialytic method of growing water-soluble ionic crystal such as potassium dihydrogen phosphate (KDP), deuterated potassium dihydrogen phosphate (DKDP), and ammonium dihydrogen phosphate (ADP).

2. Related Art Statement

Various methods have been proposed for the growth of water-soluble single crystal; namely, a temperature falling method, an evaporation method, a three-vessel constant-concentration method, an electrodialytic method, and so on. The inventors previously disclosed an electrodialytic method which had numerous advantages; for instance, the ease of control of the crystal growth rate through regulation of an electric current alone while maintaining a growth tank at a constant temperature, the availability of crystal material supply without interruption of the crystal growth, and the smallness of the growth tank.

A conventional electrodialytic method of growing ionic crystal will be described by referring to FIG. 2 which illustrates production of KDP crystal. A growth tank 51 of the figure is divided into five vessels A through E which are separated by anion-exchange membranes $\alpha_1$, $\alpha_2$ and cation-exchange membranes $\beta_1$, $\beta_2$. The five-vessel structure of the growth tank 51 is used because the pH of solutions in end vessels A and E varies with the growth of the desired crystal in a crystal growth vessel C and the provision of side vessels B and D therebetween prevents such pH variation from exerting adverse effects on the function of the crystal growth vessel C. A positive electrode 52 is disposed in one end vessel A, while a negative electrode 53 is disposed in the other end vessel E so as to apply an electric current to the growth tank 51.

After a solution of KDP is filled in all the vessels A through E of the growth tank 51, if an electric current is applied across the electrodes 52 and 53, cations ($K^+$) move from the side vessel B to the crystal growth vessel C while anions ($H_2PO_4^-$) move from the side vessel D to the crystal growth vessel C. Thus, KDP is concentrated in the crystal growth vessel C while it is diluted in the side vessels B and D. At the same time, cations ($K^+$) move from the side vessel D to the end vessel E while anions ($H_2PO_4^-$) move from the side vessel B to the end vessel A. In the end vessel A, supersaturated anions ($H_2PO_4^-$) are consumed at the positive electrode 52 to produce oxygen $O_2$, while in the other end vessel E, supersaturated cations ($K^+$) are consumed at the negative electrode 53 to produce hydrogen $H_2$. If one or more seed crystals 54 of KDP are placed in the crystal growth vessel C, the supersaturated KDP therein crystallizes on the seed crystal 54. Thus, the desired growth of KDP crystal is achieved. Supply of additional KDP powder at the side vessels B and D in compensation for the crystallization will enable continuous growth of such KDP crystal.

Such conventional electrodialytic method has a shortcoming in that, since all the vessels A through H are kept at the same temperature in a range of 20°-60° C. or at a room temperature, spurious crystals are deposited on the ion-exchange membranes $\beta_1$ and $\alpha_2$ at portions where concentrations of ingredients become high during the KDP crystallization. The spurious crystals deposited on the ion-exchange membranes also grow, and in the worst case, they cover the entire membrane surfaces and actual growth of the desired crystal in the crystal growth vessel over a long period of time becomes impossible.

SUMMARY OF THE INVENTION

Therefore, an object of the invention is to obviate the above-mentioned shortcoming of the prior art by providing an improved electrodialytic method of growing water-soluble ionic crystal, in which method deposition of spurious crystals on ion-exchange membranes is eliminated so as to facilitate growth of the desired crystal over a long period of time.

In a preferred embodiment of the method according to the invention, a cation-exchange membrane and an anion-exchange membrane are disposed in a growth tank in such a manner that a crystal growth vessel is defined in the tank between the two membranes and at least two side vessels are defined in the tank in juxtaposition to opposite sides of the crystal growth vessel while being separated therefrom by the cation-exchange membrane and the anion-exchange membrane respectively. The growth tank is placed in an outer tank, and a fluid such as water is filled in a space therebetween so as to surround the growth tank with the fluid. A solution of the material for the desired ionic crystal is filled in the crystal growth vessel and the side vessels, and an electric current is applied across the two side vessels through the crystal growth vessel so as to cause supersaturation of the above material in the crystal growth vessel by electrodialytic actions at the membranes.

The solutions in the crystal growth vessel and the side vessels are separately heated and fluid between the two tanks is also heated separately so as to maintain the temperature conditions of $T_o > T_c > T_w$, wherein $T_c$ is the temperature of the solution in the crystal growth vessel, $T_o$ is the temperature of the solution in the side vessels, and $T_w$ is the temperature of the fluid in the space between the growth tank and the outer tank.

In an embodiment of the invention, the above-mentioned fluid between the growth tank and the outer tank is water.

The inventors have found through experiments that the preferable range of the difference between the crystal growth vessel solution temperature $T_c$ and the side vessel solution temperature $T_o$ ($T_o - T_c$) is 0.8–1.5° C., and the preferable range of the difference between the crystal growth vessel solution temperature $T_c$ and the fluid temperature $T_w$ ($T_c - T_w$) is 4–7° C.

In operation, when the above-mentioned relationship is maintained among the temperatures of the solutions in the crystal growth vessel and the side vessels and the liquid between the tanks, the deposition of the spurious crystals, which is a major shortcoming of the conventional electrodialytic method, is eliminated, so that the crystallization through electrodialysis can be effected over a long period of time. Besides, the crystallization by the electrodialytic method of the invention is effected while maintaining the solutions and the fluid at constant temperatures while keeping the above temperature differences, so that the actual temperature control is easy to perform and the growth rate of the desired crystal can be controlled simply by regulating the current through the growth tank. Further, additional supply of the crystal material can be effected without interrupting the growth of the crystal.

Accordingly, as compared with the case of conventional temperature falling method which is widely used in the industries, the overall size of the apparatus for the method of the invention can be made smaller and the amount of the starting material for the crystal can be reduced. The method of the invention is particularly suitable for producing a large crystal with a cross-sectional diameter of several cm to several tens of cm and a single crystal made of very expensive starting material such as deuterated potassium dihydrogen phosphate (DKDP).

BRIEF DESCRIPTION OF THE DRAWINGS

For a better understanding of the invention, reference is made to the accompanying drawings, in which.

Figure 1:
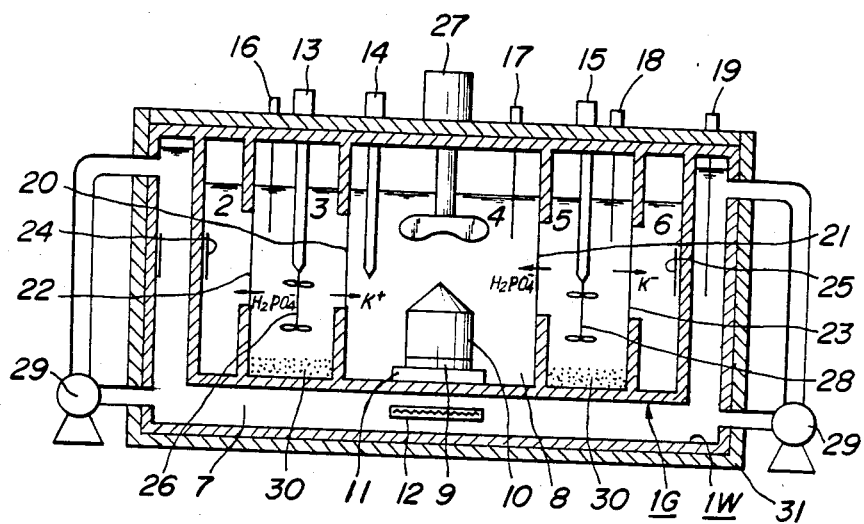
FIG. 1 is a schematic sectional view of an apparatus which is suitable for executing the electrodialytic method for growing water-soluble ionic crystal according to the invention.
Figure 2:
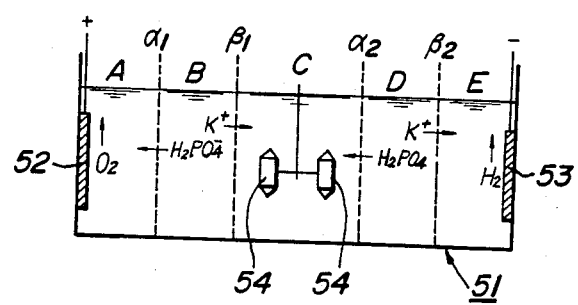
FIG. 2 is a diagrammatic illustration of operative principles of a conventional electrodialytic method for growing ionic crystal.

In the drawing, 1W is an outer tank, 1G is a growth tank, 2, 6 are end vessels, 3, 5 are side vessels, 4 is a crystal growth vessel, 7 is water, 8 is a KDP solution, 9 is a seed crystal, 10 is a KDP crystal, 11 is a seed crystal table, 12, 13, 14, 15 are heaters, 16, 17, 18, 19 are temperature sensors of controllers, 20, 23 are cation-exchange membranes, 21, 22 are anion-exchange membranes, 24 is a positive electrode, 25 is a negative electrode, 26, 27, 28 are propeller-type stirrers, 29 is a water-circulation pump, 30 is KDP powder, and 31 is heat insulating material.

DESCRIPTION OF THE PREFERRED EMBODIMENTS

FIG. 1 is a schematic sectional view of an apparatus which is suitable for executing the method of the invention. The example of the figure will be described by referring to the growth of potassium dihydrogen phosphate (KDP) which is a water-soluble ionic crystal.

Generally speaking, a water-soluble crystal such as KDP crystal grows in a temperature range of 30-80° C. Since this temperature range is close to room temperature, it is necessary to use a tank of dual structure so as to ensure good temperature control characteristics. The apparatus of FIG. 1 uses a growth tank 1G which is placed in an outer tank 1W enclosed by heat insulating material 31. The growth tank 1G has five vessels; namely, a crystal growth vessel 4, side vessels 3 and 5 disposed on opposite sides of the crystal growth vessel 4, and end vessels 2 and 6 located at opposite end portions of the growth tank 1G. Suitable fluid such as water 7 is filled in a space between the outer tank 1W and the growth tank 1G, and a water-circulation pump 29 is provided for circulating the water 7 in the space. A heater 12 and a temperature sensor 19 are disposed in the water 7 between the growth tank 1G and the outer tank 1W, and the temperature of the water 7 surrounding the growth tank 1G is kept constant by a controller (not shown) which is connected to both the above the heater 12 and the temperature sensor 19.

A KDP solution 8 is filled in the vessels 2, 3, 4, 5, and 6 of the growth tank 1G as shown in FIG. 1. The side vessels 3, 5 on opposite sides of the crystal growth vessel 4 have heaters 13, 15, temperature sensors 16, 18, and propeller-type stirrers 26, 28 respectively, so that the inside temperatures of the side vessels 3 and 5 are kept at a constant level. The stirrers 26 and 28 are for agitating the KDP solutions 8 in the side vessels 3 and 5 respectively. A positive electrode 24 is disposed in the end vessel 2, while a negative electrode 25 is disposed in the other end vessel 6, so that an electric current for electrodialysis is applied through such electrodes 24 and 25. To maintain a constant temperature, the crystal growth vessel 4 also carries a heater 14, a temperature sensor 17 and a propeller-type stirrer 27.

An anion-exchange membrane 22 is disposed between the end vessel 2 and the side vessel 3, while another anion-exchange membrane 21 is disposed between the crystal growth vessel 4 and the side vessel 5. A cation-exchange membrane 20 is disposed between the side vessel 3 and the crystal growth vessel 4, while another cation-exchange membrane 23 is disposed between the side vessel 5 and the end vessel 6. When the electric current for electrodialysis is applied across the electrodes 24 and 25 through the KDP solution 8 in the above-mentioned vessels of the growth tank 1G, the cations $K^+$ move into the crystal growth vessel 4 through the cation-exchange membrane 20, while anions $H_2PO_4^-$ move into the crystal growth vessel 4 through the anion-exchange membrane 21. Thus, the KDP concentration in the KDP solution of the crystal growth vessel 4 becomes supersaturated.

When such electric current for electrodialysis is maintained while keeping the above-mentioned temperature differences among KDP solutions in different vessels and the water between the tanks 1W and 1G, if a seed crystal 9 is placed on a seed crystal table 11 in the crystal growth vessel 4, then desired KDP crystal 10 grows on the seed crystal 9. As the KDP crystal 10 grows, the concentration of KDP in the solutions in the side vessels 3 and 5 is reduced, so that it is necessary to supply additional KDP powder 30 in the side vessels 3 and 5 in a suitable manner.

The method of growing the KDP crystal will be described in detail now. A KDP saturated solution at a temperature corresponding to the temperature for growing the KDP crystal is prepared and filled in the vessels 2, 3, 4, 5, and 6. The outer tank 1W is kept at the same temperature as that of the water 7 between the growth tank 1G and the outer tank 1W. After the temperature of the solution in the crystal growth vessel 4 is once raised by several degrees by actuating the heater 14 therein, a seed crystal 9 is placed on the seed crystal table 11. Thereafter, the heating by the heater 14 is ceased, and the temperature of the solution in the crystal growth vessel 4 is reduced to the level before the heating. Thereby, the solution in the crystal growth vessel 4 resumes its supersaturated concentration of KDP. Under such conditions, the heaters 12, 13, and 15 are actuated and controlled by using controllers (not shown) which are connected to the temperature sensors 19, 16, and 18, so as to keep the following relationship.

$$T_3 = T_5 > T_c > T_w$$

wherein $T_c$ is the temperature of the solution in the crystal growth vessel, $T_3$ is the temperature of the solution in the side vessel 3, $T_5$ is the temperature of the solution in the side vessel 5, and $T_w$ is the temperature of water in the space between the growth tank 1G and the outer tank 1W.

The above temperature relationship are the conditions which are necessary for preventing the deposition of spurious crystals on the ion-exchange membranes 20 and 21. Preferable ranges of temperature differences among solutions and water at different portions are as follows.

$$T_3 - T_c = 0.8 - 1.5° \text{ C}.$$

$$T_c - T_w = 4 - 7° \text{ C}.$$

The KDP powder 30 is supplied to the side vessels 3 and 5, and the propeller-type stirrers 26 and 28 are actuated so as to always maintain the KDP solution in the two vessels 3 and 5 as saturated. The propeller-type stirrer 27 in the crystal growth vessel 4 is to keep the temperature distribution in the vessel 4 homogeneous. When a direct current is applied across the electrodes 24 and 25 under such conditions, the electrodialysis starts. As a result, the cations $K^+$ move from the side vessel 3 into the crystal growth vessel 4, while anions $H_2PO_4^-$ move from the side vessel 5 into the crystal growth vessel 4, and the solution in the crystal growth vessel 4 becomes supersaturated and the growth of the crystal starts. With the growth of the KDP crystal 10 in the vessel 4, the KDP powder 30 in the vessels 3 and 5 is consumed. If the additional KDP powder is supplied in a suitable manner, the growth of the KDP crystal takes place continuously. Although the end vessel 2 gradually becomes basic and the end vessel 6 gradually becomes acidic, neutralization of the KDP solutions in such end vessels 2 and 6 at a rate of once a month ensures smooth growth of the crystal.

The invention will be described in further detail by referring to an experiment.

EXPERIMENT

The growth of the KDP crystal was tested by the method of the invention while using the apparatus of FIG. 1 under the following conditions:
Growth conditions:
Temperature of the crystal growth vessel 4: 40.0° C.
Temperature of the side vessels 3 and 5: 41.2° C.
Temperature of the water 7 between tanks: 35.0° C.
Amount of KDP solution in the growth tank 1G: 25 l
KDP seed crystal size: 10 cm × 10 cm × 2 cm (Z cut plate)
Rate of growth: 3 mm/day (C-axis direction)
Ion-exchange membrane size: 10 cm × 15 cm For reference, the KDP growth was effected in the same manner except that no temperature differences were provided among different vessels.

The result is shown in Table 1.

TABLE 1

| | |
|---|---|
| Without any temperature difference (prior art) | In about 3 weeks, spurious crystals started on ion-exchange membranes. In about 2 months, about ⅓ of the ion-exchange membranes were covered with spurious crystals, and the test of growth was terminated. |
| With temperature differences (invention) | After continuous growth of crystal for about 3 months, no spurious crystals were found on the ion-exchange membranes at all. |

As can be seen from Table 1, the method of the invention proved to be capable of completely eliminating the spurious crystals and performing stable growth of the KDP crystal over a long period of time.

The invention is not restricted to the illustrated embodiment, and numerous changes and modifications are possible without departing from the scope of the invention. For instance, the growth tank 1G of FIG. 1 has five vessels, but the number of such vessels in the growth tank 1G may be reduced to three or increased to more than five.

As described in detail in the foregoing, the electrodialytic method of growing water-soluble ionic crystal according to the invention maintains specific temperature differences among different vessels in a growth tank and between the growth tank and an outer tank, so that deposition of spurious crystals on ion-exchange membranes, which has been a major shortcoming of the prior art, is completely eliminated. Accordingly, the method of the invention facilitates stable growth of crystals in a continuous manner over a long period of time.

What is claimed is:

1. An electrodialytic method of growing water-soluble ionic crystal, comprising the steps of
forming a growth tank having a cation-exchange membrane and an anion-exchange membrane disposed therein so as to define a crystal growth vessel between the two membranes and two side vessels, which side vessels are juxtaposed to opposite sides of the crystal growth vessel while being separated therefrom by said cation-exchange membrane and said anion-exchange membrane respectively;
placing the growth tank in an outer tank while filling a fluid in a space therebetween so as to surround the growth tank with the fluid;
filling a solution of material for the ionic crystal in the crystal growth vessel and the side vessels; and
applying an electric current across the two sides vessels through said crystal growth vessel so as to cause supersaturation of said material in the crystal growth vessel while maintaining the temperature conditions of $$T_o > T_c > T_w$$

here, $T_c$ is temperature of the solution in the crystal growth vessel, $T_o$ is temperature of the solution in the side vessels, and $T_w$ is temperature of the fluid in the space between the growth tank and the outer tank.

2. An electrodialytic method of growing water-soluble ionic crystal as set forth in claim 1, wherein said fluid between the growth tank and the outer tank is water.

3. An electrodialytic method of growing water-soluble ionic crystal as set forth in claim 1, wherein difference between the crystal growth vessel solution temperature $T_c$ and the side vessel solution temperature $T_o$ ($T_o - T_c$) is 0.8–1.5° C. and difference between the crystal growth vessel solution temperature $T_c$ and the fluid temperature $T_w$ ($T_c - T_w$) is 4–7° C.

* * * * *